(12) United States Patent
Hollister et al.

(10) Patent No.: US 9,117,668 B2
(45) Date of Patent: Aug. 25, 2015

(54) PECVD DEPOSITION OF SMOOTH SILICON FILMS

(75) Inventors: Alice Hollister, Tigard, OR (US); Sirish Reddy, Hillsboro, OR (US); Keith Fox, Tigard, OR (US); Mandyam Sriram, Beaverton, OR (US); Joe Womack, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 119 days.

(21) Appl. No.: 13/478,999

(22) Filed: May 23, 2012

(65) Prior Publication Data

US 2013/0316518 A1 Nov. 28, 2013

(51) Int. Cl.
*H01L 21/20* (2006.01)
*H01L 21/02* (2006.01)
*H01L 27/115* (2006.01)

(52) U.S. Cl.
CPC ........ *H01L 21/0245* (2013.01); *H01L 21/0262* (2013.01); *H01L 21/02488* (2013.01); *H01L 21/02507* (2013.01); *H01L 21/02532* (2013.01);
(Continued)

(58) Field of Classification Search
CPC ............ H01L 21/205; H01L 21/32055; H01L 21/363; H01L 21/365; H01L 21/20; H01L 21/02164; H01L 21/022; H01L 21/02274; H01L 21/0245; H01L 21/02532; H01L 21/02587
USPC ............................. 438/478, 485; 257/E21.09
See application file for complete search history.

(56) References Cited

U.S. PATENT DOCUMENTS

| 5,399,387 A | 3/1995 | Law et al. |
| 5,589,233 A | 12/1996 | Law et al. |
| 5,851,602 A | 12/1998 | Law et al. |

(Continued)

FOREIGN PATENT DOCUMENTS

| DE | 101 43 235 A1 | 3/2003 |
| EP | 0 394 054 | 10/1990 |

(Continued)

OTHER PUBLICATIONS

U.S. Appl. No. 13/671,424, filed Nov. 7, 2012, entitled "In-Situ Deposition of Film Stacks," Haverkamp et al.

(Continued)

*Primary Examiner* — Julia Slutsker
*Assistant Examiner* — Natalia Gondarenko
(74) *Attorney, Agent, or Firm* — Weaver Austin Villeneuve & Sampson LLP

(57) ABSTRACT

Smooth silicon films having low compressive stress and smooth tensile silicon films are deposited by plasma enhanced chemical vapor deposition (PECVD) using a process gas comprising a silicon-containing precursor (e.g., silane), argon, and a second gas, such as helium, hydrogen, or a combination of helium and hydrogen. Doped smooth silicon films and smooth silicon germanium films can be obtained by adding a source of dopant or a germanium-containing precursor to the process gas. In some embodiments dual frequency plasma comprising high frequency (HF) and low frequency (LF) components is used during deposition, resulting in improved film roughness. The films are characterized by roughness (Ra) of less than about 7 Å, such as less than about 5 Å as measured by atomic force microscopy (AFM), and a compressive stress of less than about 500 MPa in absolute value. In some embodiments smooth tensile silicon films are obtained.

22 Claims, 8 Drawing Sheets

(52) U.S. Cl.
CPC ..... *H01L 21/02587* (2013.01); *H01L 27/11556* (2013.01); *H01L 27/11582* (2013.01)

(56) References Cited

U.S. PATENT DOCUMENTS

| | | | |
|---|---|---|---|
| 6,066,550 A | 5/2000 | Wang | |
| 6,087,278 A | 7/2000 | Kim et al. | |
| 6,207,574 B1 | 3/2001 | Lee | |
| 6,235,650 B1 | 5/2001 | Yao | |
| 6,358,573 B1* | 3/2002 | Raoux et al. | 427/578 |
| 6,407,011 B1 | 6/2002 | Ikeda et al. | |
| 6,444,277 B1 | 9/2002 | Law et al. | |
| 6,811,831 B1 | 11/2004 | Koutny et al. | |
| 6,818,533 B2* | 11/2004 | Chen et al. | 438/481 |
| 6,962,859 B2 | 11/2005 | Todd et al. | |
| 7,422,776 B2 | 9/2008 | Yim et al. | |
| 7,479,443 B2* | 1/2009 | Bauer et al. | 438/478 |
| 7,608,300 B2 | 10/2009 | Bencher et al. | |
| 7,635,651 B2 | 12/2009 | Lee et al. | |
| 7,858,431 B2 | 12/2010 | Isaka et al. | |
| 8,076,250 B1 | 12/2011 | Rajagopalan et al. | |
| 8,318,575 B2 | 11/2012 | Lehnert et al. | |
| 8,709,551 B2 | 4/2014 | Fox et al. | |
| 8,741,394 B2 | 6/2014 | Haverkamp et al. | |
| 8,895,415 B1 | 11/2014 | Fox et al. | |
| 2001/0007245 A1 | 7/2001 | Weichart | |
| 2002/0011656 A1 | 1/2002 | Swanson et al. | |
| 2004/0011279 A1 | 1/2004 | Joo | |
| 2004/0041239 A1 | 3/2004 | Ruelke et al. | |
| 2004/0087079 A1 | 5/2004 | Chen et al. | |
| 2004/0146661 A1 | 7/2004 | Kapoor et al. | |
| 2005/0040456 A1 | 2/2005 | Specht et al. | |
| 2005/0045099 A1 | 3/2005 | Bencher et al. | |
| 2005/0196960 A1 | 9/2005 | Koo et al. | |
| 2005/0229848 A1 | 10/2005 | Shinriki et al. | |
| 2005/0233591 A1 | 10/2005 | Schmitt et al. | |
| 2006/0049139 A1 | 3/2006 | Xia et al. | |
| 2006/0204673 A1 | 9/2006 | Takayasu et al. | |
| 2006/0276011 A1 | 12/2006 | Fogel et al. | |
| 2007/0059942 A1 | 3/2007 | Hu et al. | |
| 2007/0110918 A1 | 5/2007 | Yuda et al. | |
| 2007/0144215 A1 | 6/2007 | Kharas | |
| 2007/0215877 A1 | 9/2007 | Kato et al. | |
| 2007/0264842 A1 | 11/2007 | Kim | |
| 2008/0050883 A1 | 2/2008 | Enicks | |
| 2008/0073645 A1* | 3/2008 | Todd et al. | 257/52 |
| 2008/0113521 A1 | 5/2008 | Tanaka et al. | |
| 2008/0153300 A1 | 6/2008 | Bok | |
| 2008/0202688 A1 | 8/2008 | Wu et al. | |
| 2008/0268176 A1 | 10/2008 | Choi et al. | |
| 2008/0299747 A1* | 12/2008 | Arai et al. | 438/485 |
| 2009/0022908 A1 | 1/2009 | Yang et al. | |
| 2009/0035927 A1 | 2/2009 | Olsen et al. | |
| 2009/0095221 A1 | 4/2009 | Tam et al. | |
| 2009/0097105 A1 | 4/2009 | Hart et al. | |
| 2009/0104790 A1 | 4/2009 | Liang | |
| 2009/0159119 A1 | 6/2009 | Basol | |
| 2009/0246942 A1* | 10/2009 | Imaeda et al. | 438/478 |
| 2009/0286402 A1* | 11/2009 | Xia et al. | 438/703 |
| 2010/0012030 A1* | 1/2010 | Todd et al. | 118/708 |
| 2010/0102359 A1 | 4/2010 | Khan et al. | |
| 2010/0109065 A1 | 5/2010 | Oh et al. | |
| 2010/0184302 A1 | 7/2010 | Lee et al. | |
| 2010/0210093 A1 | 8/2010 | Kato et al. | |
| 2011/0018044 A1 | 1/2011 | Lim et al. | |
| 2011/0036168 A1 | 2/2011 | Lin | |
| 2011/0143019 A1* | 6/2011 | Mosso et al. | 427/58 |
| 2011/0151142 A1 | 6/2011 | Seamons et al. | |
| 2011/0236594 A1 | 9/2011 | Haverkamp et al. | |
| 2011/0236600 A1 | 9/2011 | Fox et al. | |
| 2012/0142172 A1 | 6/2012 | Fox et al. | |
| 2013/0157466 A1 | 6/2013 | Fox et al. | |
| 2013/0171834 A1 | 7/2013 | Haverkamp et al. | |
| 2013/0267081 A1 | 10/2013 | Fox et al. | |
| 2014/0048141 A1 | 2/2014 | Womack et al. | |
| 2014/0357064 A1 | 12/2014 | Fox et al. | |
| 2015/0013607 A1 | 1/2015 | Haverkamp et al. | |

FOREIGN PATENT DOCUMENTS

| | | |
|---|---|---|
| JP | 06-240459 A | 8/1994 |
| JP | 2000-208422 | 7/2000 |
| WO | WO 2009/098548 | 8/2009 |
| WO | WO2012/036808 | 3/2012 |
| WO | WO 2013/123143 | 8/2013 |

OTHER PUBLICATIONS

U.S. Appl. No. 13/766,696, filed Feb. 13, 2013, entitled "Silicon-Nitride Films for Semiconductor Device Applications," Fox et al.

US Office Action dated Nov. 26, 2012 issued in U.S. Appl. No. 12/970,846.

International Search Report and Written Opinion mailed Apr. 9, 2012, issued in Application No. PCT/US2011/047107.

Ong, Y. et al., Process Analysis and Optimization on PECVD Amorphous Silicon on Glass Substrate, Journal of Physics: Conference Series, vol. 34, 2006, pp. 812-817.

U.S. Appl. No. 13/667,282, filed Nov. 2, 2012, entitled "Flow Balancing in Gas Distribution Networks," Womack et al.

U.S. Appl. No. 13/907,742, filed May 31, 2013, entitled "Tensile Stressed Doped Amorphous Silicon," Fox et al.

US Final Office Action dated May 16, 2013 issued in U.S. Appl. No. 12/970,846.

US Office Action dated Sep. 11, 2013 issued in U.S. Appl. No. 12/970,846.

US Office Action dated Apr. 9, 2013 issued in U.S. Appl. No. 12/970,853.

US Final Office Action dated Aug. 9, 2013 issued in U.S. Appl. No. 12/970,853.

Singapore Search Report and Written Opinion dated Apr. 18, 2013, issued in SG 201102162-3.

PCT International Preliminary Report on Patentability and Written Opinion dated Mar. 28, 2013, issued in PCT/US2011/047107.

PCT International Search Report and Written Opinion dated Jun. 3, 2013, issued in PCT/US2013/026069.

"Diaphragm Valves," (Oct. 2003) *Microelectronics Product Line, Catalog* 4505/USA, Parker Hannifin Corporation, pp. 1-49.

Han et al. (Jun. 1994) "Modeling the Properties of PECVD Silicon Dioxide Films Using Optimzed Back-Propagation Neural Networks," IEE Transaction on Components, Packaging, and Manufacturing Technology—Part A, 17(2):174-182.

Jang, J., et al., "Vertical Cell Array Using TCAT (Terabit Cell Array Transistor) Technology for Ultra High Density NAND Flash Memory," 2009 *Symposium on VLSI Technology Digest of Technical Papers*, 2009, pp. 192-193.

Kim, J., et al., "Novel Vertical-Stacked-Array-Transistor (VSAT) for Ultra-High-Density and Cost-Effective NAND Flash Memory Devices and SSD (Sold State Drive)," 2009 *Symposium on VLSI Technology Digest of Technical Papers*, 2009, pp. 186-187.

Kim, W., et al., "Multi-Layered Vertical Gate NAND Flash Overcoming Stacking Limit for Terabit Density Storage," 2009 *Symposium on VLSI Technology Digest of Technical Papers*, 2009, pp. 188-189.

Moisan, M., et al., (Oct. 1987) "New surface wave launchers for sustaining plasma columns at submicrowave frequencies (1-300 MHz)" *Rev. Sci. Instrum.* 58(10):1895-1900.

Hoogeland et al., (2009) "Plasma-assisted atomic layer deposition of TiN/$Al_2O_3$ stacks for metal-oxide-semiconductor capacitor applications," *Journal of Applied Physics* 106, 114107-1-114107-7, 7pp.

Schmidt et al., (2001) "Surface Passivation of silicon solar cells using plasma-enhanced chemical-vapour-deposited SiN films and thin thermal $SiO_2$/plasma SiN stacks." *Semicond. Sci. Technol.*, 16:164-170.

Su, Chen-Yi, et al., (2012) "Deposition and characterization of MgO/Si gate stacks grown by molecular beam epitaxy," *Thin Solid Films* 520:4508-4511.

(56) References Cited

OTHER PUBLICATIONS

Viana et al. (Jun. 2001) "Analysis of $SiO_2$ Thin Film Deposited by PECVD using an Oxygen-TEOS-Argon Mixture," *Brazilian Journal of Physics*, 31(2):299-303.
US Notice of Allowance dated Jan. 24, 2014 in U.S. Appl. No. 12/970,846.
US Office Action dated Feb. 28, 2014 in U.S. Appl. No. 13/671,424.
US Notice of Allowance dated Dec. 18, 2013 in U.S. Appl. No. 12/970,853.
US Office Action dated Jan. 30, 2014 in U.S. Appl. No. 13/313,422.
Singapore Search and Examination Report dated Nov. 28, 2013, issued in SG 201102162-3.
Bahari et al., (Jul./Aug. 2006) "Growth of a stacked silicon nitride/silicon oxide dielectric on Si (100)," *J. Vac. Sci. Technol.* B 24(4):2119-2123.
Kim et al., (2013) "Double antireflection coating layer with silicon nitride and silicon oxide for crystalline silicon solar cell," *J. Electroceram*, 30:41-45.
Schultz et al., (2005) "Silicon Oxide/Silicon Nitride Stack System for 20% Efficient Silicon Solar Cells," *IEEE*, pp. 872-876.
Zohni et al., (2007) "Investigating thin film stresses in stacked silicon dioxide/silicon nitride structures and quantifying their effects on frequency response," *J. Micromech. Microeng.* 17:1042-1051.
U.S. Appl. No. 14/262,196, filed Apr. 25, 2014, entitled "In-Situ Deposition of Film Stacks," Haverkamp et al.
US Notice of Allowance dated Jul. 14, 2014 issued in U.S. Appl. No. 13/671,424.
US Final Office Action dated May 13, 2014 issued in U.S. Appl. No. 13/313,422.
US Office Action dated Jul. 10, 2014 issued in U.S. Appl. No. 13/857,566.
US Notice of Allowance dated Jun. 23, 2014 issued in U.S. Appl. No. 13/907,742.
Singapore Search and Examination Report dated Mar. 13, 2014, issued in SG 201301550-8.
PCT International Preliminary Report on Patentability and Written Opinion dated Aug. 28, 2014, issued in PCT/US2013/026069.
US Notice of Allowance dated Dec. 15, 2014 issued in U.S. Appl. No. 13/671,424.
US Notice of Allowance dated Oct. 16, 2014 issued in U.S. Appl. No. 13/907,742.
Gatz, S., et al., (2008) "Thermal stability of amorphous silicon/silicon nitride stacks for passivating crystalline silicon solar cells," *Applied Physics Letters* 93:(173502):pp. 1-3.
Keipert-Colberg, Sinje, et al., (Sep. 5-9, 2011) "Investigation of a PECVD silicon oxide/silicon nitride passivation system concerning process influences," *Presented at the 26th European PV Solar Energy Conference and Exhibition*, Hamburg, Germany, pp. 1-4.

\* cited by examiner

PECVD DEPOSITION OF SMOOTH SILICON FILMS

FIELD OF THE INVENTION

The present invention pertains to the methods of depositing smooth silicon films having low compressive stress and to methods of depositing smooth tensile silicon films. Specifically, the invention is useful in semiconductor processing, particularly in the field of fabrication of three-dimensional (3D) memory devices and in deposition of hardmasks on semiconductor substrates.

BACKGROUND OF THE INVENTION

Patterning film stacks for three-dimensional (3D) memory devices can be difficult. Some conventional atomic layer deposition (ALD), chemical vapor deposition (CVD), high-density plasma chemical vapor deposition (HDP-CVD) and plasma-enhanced chemical vapor deposition (PECVD) processes for depositing film layers may produce unacceptably rough films, cause unacceptable interfacial mixing between film layers, and may lead to interfacial defects caused by vacuum breaks between successively deposited film layers. The resulting rough film interfaces and interfacial defects may be magnified by subsequently deposited layers as the film stack is built, so that the top surface of the film stack may be unacceptably rough for downstream patterning processes. Further, interfacial defects within the film stack may lead to structural and/or electrical defects in the 3D memory device. In addition to roughness, stress values of deposited films present an important consideration.

SUMMARY OF THE INVENTION

Smooth silicon and silicon germanium films with low compressive stress, and smooth tensile silicon and silicon germanium films are highly desirable for many applications employing stacks of layers of materials. Such films are particularly needed for 3D memory fabrication, where stacks containing more than 10, 20, or even 50 layers are deposited on a substrate, and are then patterned. In addition, such films are desirable for hardmask applications, where patterning calls for low-roughness and low compressive stress properties. Methods provided herein allow for deposition of smooth silicon and silicon germanium films by PECVD, where deposited films in addition to low roughness have low compressive stress or where the stress of deposited films is tensile.

In some embodiments, smooth silicon or silicon germanium films, suitable for use as hardmasks are characterized by surface roughness (Ra) of less than about 7 Å, as measured by atomic force microscopy (AFM) and have a compressive stress of less than 500 MPa, such as less than about 300 MPa in absolute value (in other words, have stress value that is less negative than −400 MPa or −300 MPa). In other embodiments, silicon or silicon germanium films have surface roughness of less than about 7 Å, and have a tensile stress (e.g., tensile stress of up to 200 MPa). Several sets of PECVD conditions for depositing such films, was developed.

In one aspect, a method for forming a smooth silicon film on a substrate in a PECVD apparatus includes supplying a process gas to the PECVD apparatus, wherein the process gas comprises a silicon-containing precursor (e.g., silane), argon, and a second gas (e.g., helium, hydrogen or combinations thereof); and forming a plasma in the PECVD apparatus to deposit a smooth silicon film on the substrate, under conditions configured for depositing a silicon film characterized by roughness (Ra) of less than about 7 Å, and a compressive stress of less than about 500 MPa in absolute value, more preferably less than about 300 MPa in absolute value, or under conditions configured for depositing a smooth tensile silicon film (e.g., with a tensile stress of up to 200 MPa), characterized by Ra of less than about 7 Å.

The deposited silicon films include amorphous and polycrystalline silicon films, and may be doped or undoped, e.g., with group III dopants, or group V dopants. When doped silicon films are deposited, a source of dopant is added to the process gas. For example, a boron-containing reactant (e.g., diborane) is added to deposit boron-doped silicon films, a phosphorus-containing reactant (e.g., phosphine) is added to deposit phosphorus-doped silicon films, and an arsenic-containing reactant (e.g., arsine) is added to deposit arsenic-doped silicon films. Provided methods are also useful for depositing smooth silicon germanium films with low compressive stress or silicon germanium films with tensile stress. A method for forming a smooth silicon germanium film on a substrate in a PECVD apparatus includes supplying a process gas to the PECVD apparatus, wherein the process gas comprises a silicon-containing precursor (e.g., silane), a germanium-containing precursor (e.g., germane), argon, and a second gas (e.g., helium, hydrogen or combinations thereof); and forming a plasma in the PECVD apparatus to deposit a smooth silicon germanium film on the substrate, under conditions configured for depositing a silicon germanium film characterized by roughness (Ra) of less than about 7 Å, and a compressive stress of less than about 500 MPa in absolute value, more preferably less than about 300 MPa in absolute value, or under conditions configured for depositing a smooth tensile silicon germanium film, characterized by Ra of less than about 7 Å.

The following parameters of the deposition process, either taken alone or, more preferably, in combination provide films with a combination of desirable stress and roughness properties. The presence of argon in the process gas is significant for lowering compressive stress of the film. Preferably, in addition to argon, a second gas (such as helium, hydrogen, or combinations thereof) is also included in the process gas. The concentration of a silicon-containing precursor in the process gas by volume (equivalent to the ratio of the flow rate of silicon-containing precursor relative to the total flow rate of the process gas) should be relatively low. For example, in many embodiments, the flow rate of silane should not exceed 12% of the total process gas flow. In many embodiments, the flow rate of silane should be kept at below 5% of the total process gas flow, such as in a low range of between about 0.05-2%. The flow of argon, in some embodiments, is between about 15-85% of the total flow of the process gas.

In some embodiments, the deposition is preferably performed using dual frequency plasma. The presence of a low frequency radio frequency (LF RF) component in addition to the high frequency radio frequency (HF RF) component allows deposition of Si films with very low film roughness also having low compressive stress. This combination of properties cannot be easily achieved by conventional methods. In some embodiments the LF power is between about 17-80% of total power supplied to generate dual frequency plasma.

Deposition of provided films can be performed at temperatures in the range of between about 300-650° C., more preferably at temperatures of between about 350-600° C. High temperatures of between about 500-600° C. are preferred in some embodiments. The deposition pressures of between about 1-9 torr, such as 2-6 torr are found to be suitable.

In one embodiment, the depositions of smooth silicon films with low compressive stress or smooth, tensile silicon films are performed using a process gas consisting essentially of silane, argon, helium and, optionally, hydrogen, using process conditions shown in Table 1.

TABLE 1

| Temperature | 300-550° C. |
|---|---|
| Pressure | 2-6 Torr |
| Silane % of total flow | 0.05-12% |
| Argon % of total flow | 16-84% |
| Helium % of total flow | 25-83% |
| LF % of total power | 17-80% |

In some embodiments, the provided films are deposited for hardmask applications on a semiconductor substrate at a thickness of between about 500-10,000 Å.

In some embodiments the smooth silicon or silicon germanium film is deposited as part of a memory device stack. Such a stack may include, for example, alternating layers of smooth silicon, deposited using provided methods, and silicon oxide; alternating layers of smooth undoped silicon and doped silicon (of which one or both layers may be deposited using methods provided herein; or alternating layers of smooth silicon deposited using provided methods and silicon nitride layers. Specifically, in some embodiments stacks containing alternating layers of smooth undoped silicon and silicon nitride are provided. In general, smooth films provided herein (doped or undoped silicon, or silicon germanium) can be used in stacks of alternating layers with layers of any suitable material. The thickness of smooth films deposited in memory stacks is typically between about 200-800 Å. Such films are deposited under conditions that provide films with surface roughness of less than about 5 Å, such as less than about 4 Å with a compressive stress of less than about 300 MPa in absolute value.

In one embodiment, smooth silicon films are deposited, using both HF and LF plasma, wherein the process gas comprises between about 0.1-4.5% of silane and between about 1.5-82% of argon by volume, at a pressure of between about 1-9 torr, and a temperature of between about 350-650 degrees C. The process gas further includes a second gas, e.g., helium, hydrogen, or combinations thereof. Deposited smooth silicon films have compressive stress of less than about 500 MPa, such as less than about 300 MPa by absolute value or have a tensile stress.

In some embodiments it is possible to obtain smooth silicon films with low compressive stress or smooth silicon films having tensile stress, using a single frequency (HF RF-only) deposition process. The following conditions for depositing a film having an Ra of less than about 5 Å, are used: the process gas comprises between about 0.05-1.5% of silane and between about 2-70% of argon by volume, and also includes a second gas (e.g., helium, hydrogen, or combinations thereof). The deposition is performed using HF plasma at a pressure of between about 1-9 torr, and a temperature of between about 350-650 degrees C.

The methods provided herein can be integrated with patterning processes. Thus, the methods can further include the steps of applying photoresist to the substrate; exposing the photoresist to light; patterning the resist and transferring the pattern to the substrate; and selectively removing the photoresist from the substrate.

In another aspect, an apparatus for depositing smooth silicon films or smooth silicon germanium films is provided. The apparatus includes a PECVD process chamber having an inlet for introduction of a process gas; and a controller comprising program instructions for conducting any of the processes provided herein. For example the controller may include program instructions for supplying a process gas to the PECVD chamber, wherein the process gas comprises a silicon-containing precursor, argon, and a second gas (e.g., helium, hydrogen or a mixture thereof); and forming a plasma in the apparatus to deposit a smooth silicon film on the substrate, under conditions configured for depositing a silicon film characterized by roughness (Ra) of less than about 7 Å, and a compressive stress of less than about 500 MPa in absolute value, or under conditions configured for depositing a smooth tensile silicon film, characterized by Ra of less than about 7 Å.

In another aspect, a system including such an apparatus, and a stepper is provided.

In another aspect, a non-transitory computer machine-readable medium comprising program instructions for control of a PECVD apparatus, is provided, wherein the program instructions include a code for conducting any of the processes described herein. For example, some embodiments provide a code for the process which includes steps of supplying a process gas wherein the process gas comprises a silicon-containing precursor, argon, and a second gas (e.g., helium, hydrogen, or combinations thereof); and forming a plasma in the PECVD apparatus to deposit a smooth silicon film on the substrate, under conditions configured for depositing a silicon film characterized by roughness (Ra) of less than about 7 Å, and a compressive stress of less than about 500 MPa in absolute value, or under conditions configured for depositing a smooth tensile silicon film, characterized by Ra of less than about 7 Å.

These and other features and advantages of the present invention will be described in more detail below with reference to the associated drawings.

DETAILED DESCRIPTION

Figure 1:
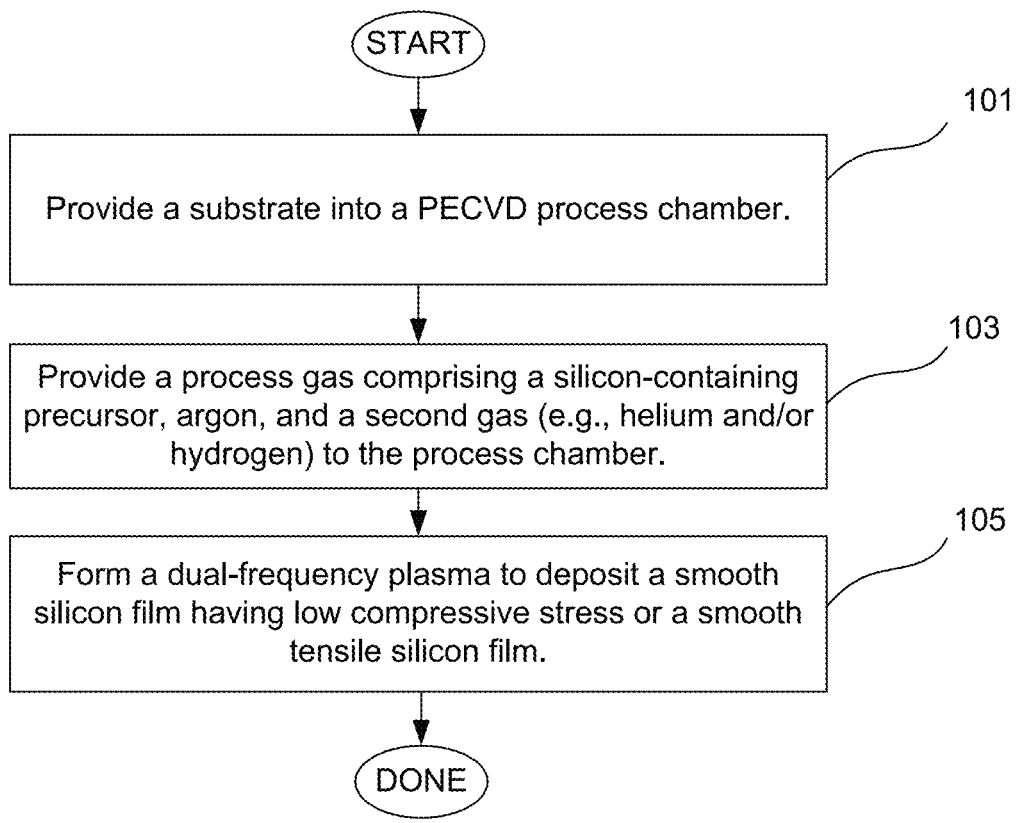
FIG. 1 is a process flow diagram illustrating a smooth silicon deposition method in accordance with an embodiment of the invention.

Smooth silicon and silicon germanium films are provided and methods of forming such films by PECVD are described.

Provided smooth films are also characterized by very low compressive stress or are characterized by tensile stress. This combination of roughness and stress properties is highly desirable in many applications, particularly in applications involving patterning of deposited layers, and is difficult to achieve using conventional PECVD techniques.

Smooth films, as used in this description, refer to films having surface roughness of less than about 7 Å. In many embodiments surface roughness of less than about 5 Å, such as less than about 4 Å, is achieved. Surface roughness refers to an $R_a$ value determined by atomic force microscopy (AFM). In the examples provided herein surface roughness is measured on a 1,000 Å thick film deposited on 1,000 Å of thermal oxide on a bare silicon substrate. Provided smooth films have a compressive stress of less than about 500 MPa, such as less than about 400 MPa and less than about 300 MPa in absolute value (in other words, less negative stress values than −500 MPa, −400 MPa, or −300 MPa). In some embodiments provided smooth films are characterized by tensile stress, e.g., tensile stress of up to about 200 MPa.

Smooth silicon films include undoped and doped silicon films, where the suitable dopants include but are not limited to boron, phosphorus, and arsenic. The dopant is typically present at a concentration of less than about 30% atomic. Both amorphous and polycrystalline silicon are within the scope of the embodiments provided herein. In some embodiments, smooth silicon germanium films, are provided.

Smooth films with low compressive stress and smooth films with tensile stress provided herein can be used in a variety of applications, particularly in semiconductor processing applications which require depositions of stacks of layers and/or in applications that require patterning. In some embodiments, the films are deposited on semiconductor substrates as hardmasks. In other embodiments, the films are deposited on semiconductor substrates as individual layers in stacks of layers used in 3D memory devices (e.g., NAND memories). The term "semiconductor substrate" as used herein refers to substrates that include exposed or unexposed semiconductor materials (e.g., silicon wafers or chips).

Silicon and silicon germanium films that are characterized simultaneously by low roughness and low compressive stress are very difficult to obtain. This is due to the fact that in PECVD-deposited films roughness of deposited films tends to increase as the absolute value of compressive stress decreases. Therefore, PECVD films with Ra of less than about 7 Å, and a compressive stress of less than about 300 MPa in absolute value, are particularly difficult to obtain. Methods for obtaining films with Ra less than about 7 Å and a compressive stress of 300 MPa or lower in absolute value are provided herein. In some embodiments, methods for obtaining films with Ra of less than about 5 Å and a compressive stress of 300 MPa and lower, are provided.

It was unexpectedly discovered that addition of argon in the PECVD process gas, when combined with dual frequency (HF and LF) plasma generation, leads to formation of smooth silicon films with very low compressive stress.

A process flow diagram for depositing a silicon film with an Ra of less than about 7 Å and a compressive stress of less than about 500 MPa (such as less than about 300 MPa) is shown in FIG. 1. The process starts in 101, by providing the substrate to the PECVD process chamber. A process gas comprising a silicon-containing precursor (e.g., silane or disilane), argon, and a second gas (e.g., helium, hydrogen, or both) is introduced into the process chamber in operation 103. In operation 105, a dual frequency plasma is formed to deposit a smooth silicon film with low compressive stress, or a smooth tensile silicon film.

The deposition temperature (referring to PECVD pedestal setting) can range from 300 to 650° C., more preferably from 350 to 650° C., and even more preferably from 500 to 600° C. The deposition is typically performed at a pressure range of between about 1-9 torr, such as at between about 2-6 torr. The composition of the process gas is of high importance. The process gas includes a silicon-containing precursor, such as silane, preferably at a relatively low concentration of between about 0.05-12% of the total gas volume, such as of between about 0.05-5%, and, in some embodiments of between about 0.05-2% of the total process gas volume. Low concentration of silane significantly improves surface roughness of formed films. The process gas further includes argon, which is found to be useful in reducing the compressive stress of formed films. The concentration of argon, in some embodiments, ranges from between about 1% to 85% of the total gas volume, more preferably from between about 15-80% of the total gas volume. Significantly, the process gas further includes an additional gas, such as helium, hydrogen, or a combination of helium and hydrogen. In the embodiment illustrated in FIG. 1, plasma is generated using dual frequency (HF RF and LF RF) generation. In a typical process, the high frequency RF component is generally between about 2-60 MHz; in a preferred embodiment, the HF component is about 13.56 MHz. The LF component frequency can range between about 100 kHz and 2 MHz. A typical frequency range for LF plasma source is between about 50 kHz to 500 kHz, more preferably between about 370-430 kHz. The power applied for plasma generation will depend on the size of the apparatus and on the number of processed substrates. A suitable HF RF power level for processing four 300 mm wafers in one chamber is in the range of 100-4,000 watts (corresponding to a power density on the semiconductor substrate of 0.04 to 1.40 W/cm$^2$), more preferably in the range of 500-1500 watts (corresponding to a power density on the semiconductor substrate of 0.18 to 0.53 W/cm$^2$). A suitable LF power for processing four 300 mm wafers in one chamber is in the range of 300-2,000 watts (corresponding to a power density on the semiconductor substrate of 0.11 to 0.71 W/cm$^2$), more preferably in the range of 300-1000 watts (corresponding to a power density on the semiconductor substrate of 0.11 to 0.35 W/cm$^2$). In some embodiments, LF power preferably should be between about 17-80% of total power.

Figure 2A:
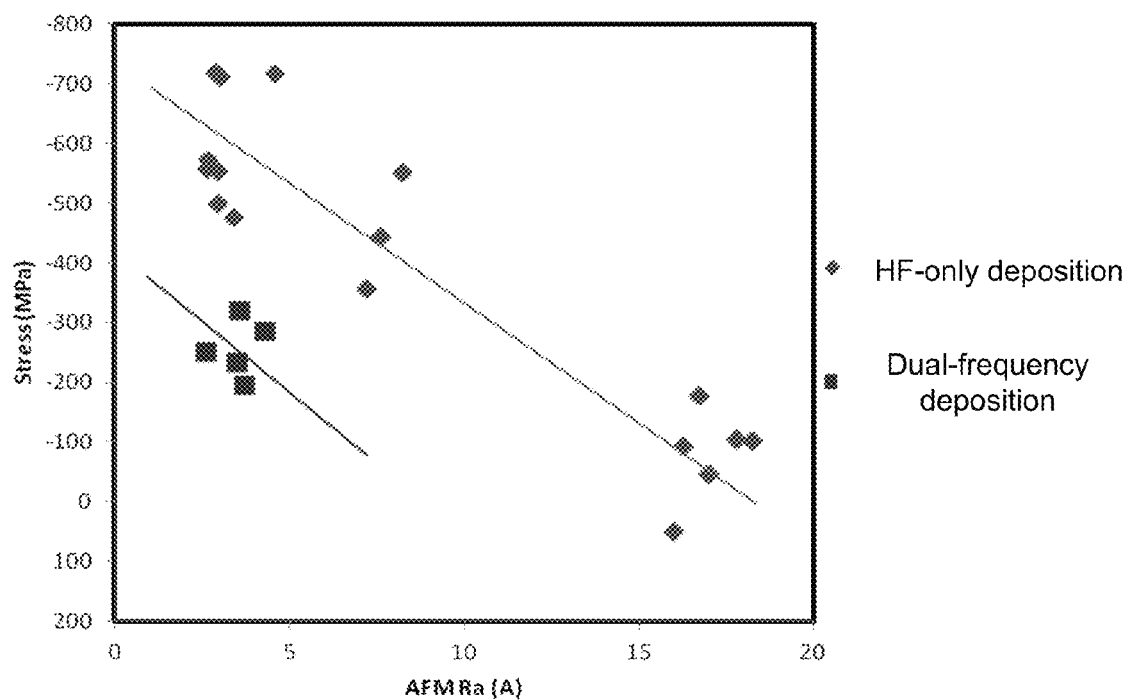
FIG. 2A is an experimental plot illustrating surface roughness and stress values of two series of deposited silicon films, where the first series was deposited using single-frequency PECVD in the absence of argon (diamonds), and the second series was deposited using dual frequency PECVD in the presence of argon (squares).

FIG. 2A illustrates the effect of dual-frequency plasma having HF and LF components on roughness and stress characteristics of PECVD-deposited films. The Ra values are shown on the X-axis, while stress values are shown on the Y-axis. Negative stress values correspond to compressive stress, while positive stress values correspond to tensile stress. The plot shows roughness and stress values for two series of films. The diamonds belong to the series with HF-only PECVD deposition which employs a process gas consisting of silane, argon, helium, and hydrogen, while squares belong to the series with dual frequency (HF and LF) PECVD deposition, where the process gas consists of silane, argon, helium, and hydrogen. While in both cases roughness negatively correlates with compressive stress (films with lower roughness have more compressive stress), it can be seen that addition of LF component shifts the film properties to a more desirable space, characterized generally by lower roughness and lower compressive stress. Thus, for example, under dual-frequency conditions silicon films with Ra of less than about 5 Å and compressive stress of less than about 300 MPa in absolute value (less negative than −300 MPa), can be obtained.

Several examples of suitable conditions for depositing smooth films with low compressive stress, and smooth films with tensile stress will now be illustrated.

Exemplary process conditions for depositing smooth silicon films having Ra of less than about 7 Å, and compressive stress of 300 MPa and less in absolute value, are provided in Table 1. In this example, films are deposited using a process gas consisting essentially of silane, helium, argon and, optionally, hydrogen.

TABLE 1

| Temperature | 300-550° C. |
|---|---|
| Pressure | 2-6 Torr |
| Silane % of total flow | 0.05-12% |
| Argon % of total flow | 16-84% |
| Helium % of total flow | 25-83% |
| LF % of total power | 17-80% |

Example 1

In one experimentally validated example, a smooth silicon film was deposited at a temperature of 530° C. and at a pressure of 5.1 Torr from a process gas consisting essentially of silane (0.19% of total process gas volume), argon (38% of total process gas volume), helium (57% of total process gas volume), and hydrogen (4% of total process gas volume) using dual frequency plasma (13.56 MHz and 400 kHz), where LF power was at 50% of total power. The deposited smooth silicon film had Ra of 3.5 Å and a stress of −300 MPa.

Example 2

In another experimental example, a smooth silicon film was deposited at a temperature of 530° C. and at a pressure of 5.1 Torr from a process gas consisting essentially of silane (0.19% of total process gas volume), argon (38% of total process gas volume), helium (57% of total process gas volume), and hydrogen (4% of total process gas volume) using dual frequency plasma (13.56 MHz and 400 kHz), where LF power was at 75% of total power. The deposited smooth silicon film had Ra of 4.2 Å and a stress of −280 MPa.

Example 3

In another experimental example, a smooth silicon film was deposited at a temperature of 350° C. and at a pressure of 3 Torr from a process gas consisting essentially of silane (0.13% of total process gas volume), argon (33% of total process gas volume), and helium (66% of total process gas volume), using dual frequency plasma (13.56 MHz and 400 kHz), where LF power was at 17% of total power. The deposited smooth silicon film had Ra of 2.8 Å and a stress of −270 MPa.

Another set of conditions, suitable for depositing smooth films having low compressive stress or smooth films having tensile stress is shown in Table 2. The films have an Ra of less than about 5 Å, and a compressive stress of less than 500 MPa in absolute value, including films having a compressive stress of less than 300 MPa in absolute value. Deposition is performed using a process gas consisting essentially of silane, argon, helium, and hydrogen using dual frequency plasma. The flow rates and power levels are listed for an apparatus accommodating four 300 mm wafers. It is understood that one of skill in the art would be able to scale these values to the apparatus of any size, if desired.

TABLE 2

| Temperature | 350-650° C. |
|---|---|
| Pressure | 1-9 Torr |
| Silane, % of total flow | 0.1-4.4% |
| Argon, % of total flow | 1.6-82% |
| Silane flow | 40-120 sccm |
| Helium flow | 2000-20,000 sccm |
| Hydrogen flow | 200-2,000 sccm |
| Argon flow | 500-10,000 sccm |
| Total flow | 2,740-32,120 sccm |
| HF power | 100-4,000 watts |
| LF power | 300-2,000 watts |

In this embodiment, HF RF power density is preferably in the range of between about 0.04-1.41 W/cm2, while LF RF power density is preferably in the range of between about 0.11-0.71 W/cm2.

Example 4

In one experimentally validated example, a smooth silicon film was deposited at a temperature of 550° C. from a process gas consisting essentially of silane (provided at 80 sccm, 0.5% of total process gas volume), argon (provided at 8,000 sccm, 55% of total process gas volume), helium (provided at 6,000 sccm), and hydrogen (provided at 500 sccm) using dual frequency plasma (13.56 MHz and 400 kHz), where HF power was 1,000 Watts, and LF power was 1,900 Watts for a chamber housing four 300 mm wafers. The deposited smooth silicon film had Ra of 4.1 Å and a stress of −180 MPa.

Example 5

In another experimental example, a smooth silicon film was deposited at a temperature of 550° C. from a process gas consisting essentially of silane (provided at 80 sccm, 0.5% of total process gas volume), argon (provided at 8,000 sccm, 48% of total process gas volume), helium (provided at 8,000 sccm), and hydrogen (provided at 500 sccm) using dual frequency plasma (13.56 MHz and 400 kHz), where HF power was 1,000 Watts, and LF power was 600 Watts for a chamber housing four 300 mm wafers. The deposited smooth silicon film had Ra of 2.7 Å and a stress of −399 MPa.

Example 6

In another experimental example, a smooth silicon film was deposited at a temperature of 550° C. from a process gas consisting essentially of silane (provided at 80 sccm, 0.5% of total process gas volume), argon (provided at 8,000 sccm, 48% of total process gas volume), helium (provided at 8,000 sccm), and hydrogen (provided at 500 sccm) using dual frequency plasma (13.56 MHz and 400 kHz), where HF power was 1,000 Watts, and LF power was 1300 Watts for a chamber housing four 300 mm wafers. The deposited smooth silicon film had Ra of 3.1 Å and a stress of −250 MPa.

Figure 2B:
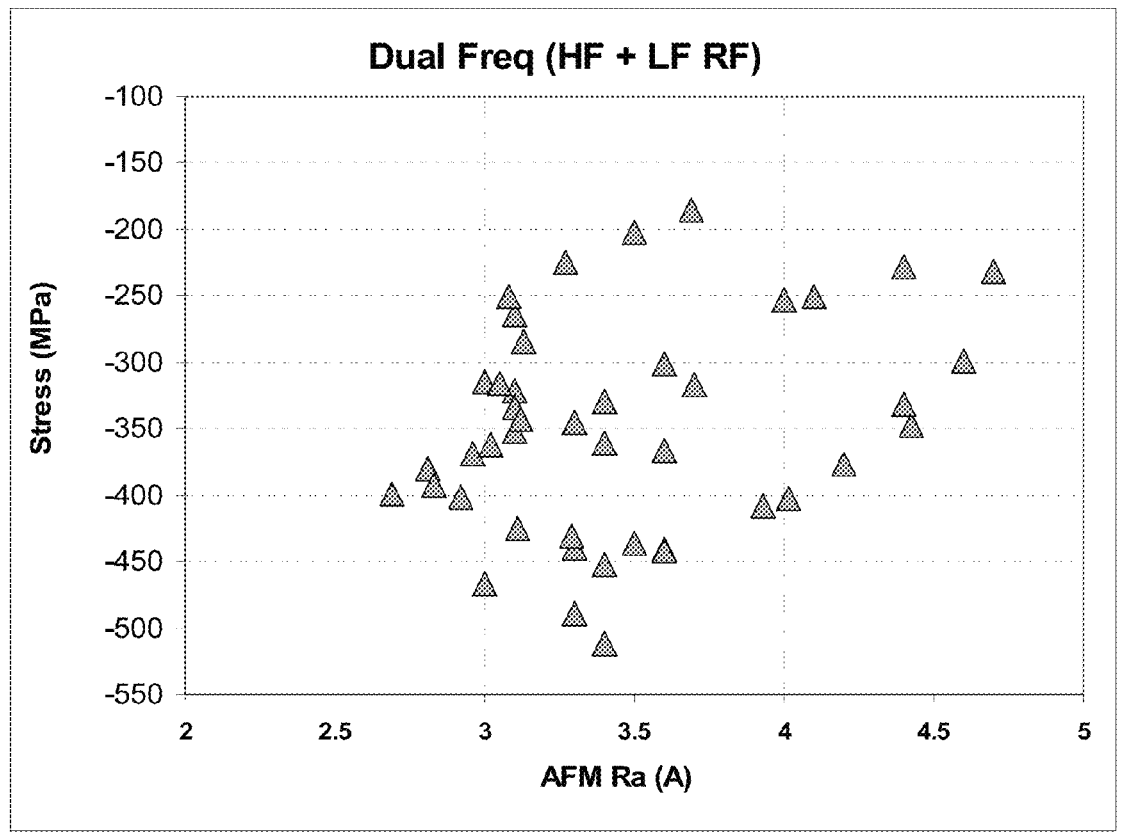
FIG. 2B is an experimental plot illustrating surface roughness and stress values of smooth silicon films deposited using dual frequency PECVD, in accordance with an embodiment provided herein.

FIG. 2B illustrates properties of smooth silicon films deposited under the process conditions shown in Table 2. Ra values are shown on the X-axis, and stress values are shown on the Y-axis. It can be seen that provided methods can be used to form films which simultaneously have Ra of less than 5 Å, and compressive stress of less than 500 MPa in absolute value, including films that simultaneously have Ra of less than 5 Å, and compressive stress of less than 300 MPa in absolute value. Films having Ra of less than about 3.5 Å, and compressive stress of less than 300 MPa in absolute value, are also provided by these methods.

Figure 2C:
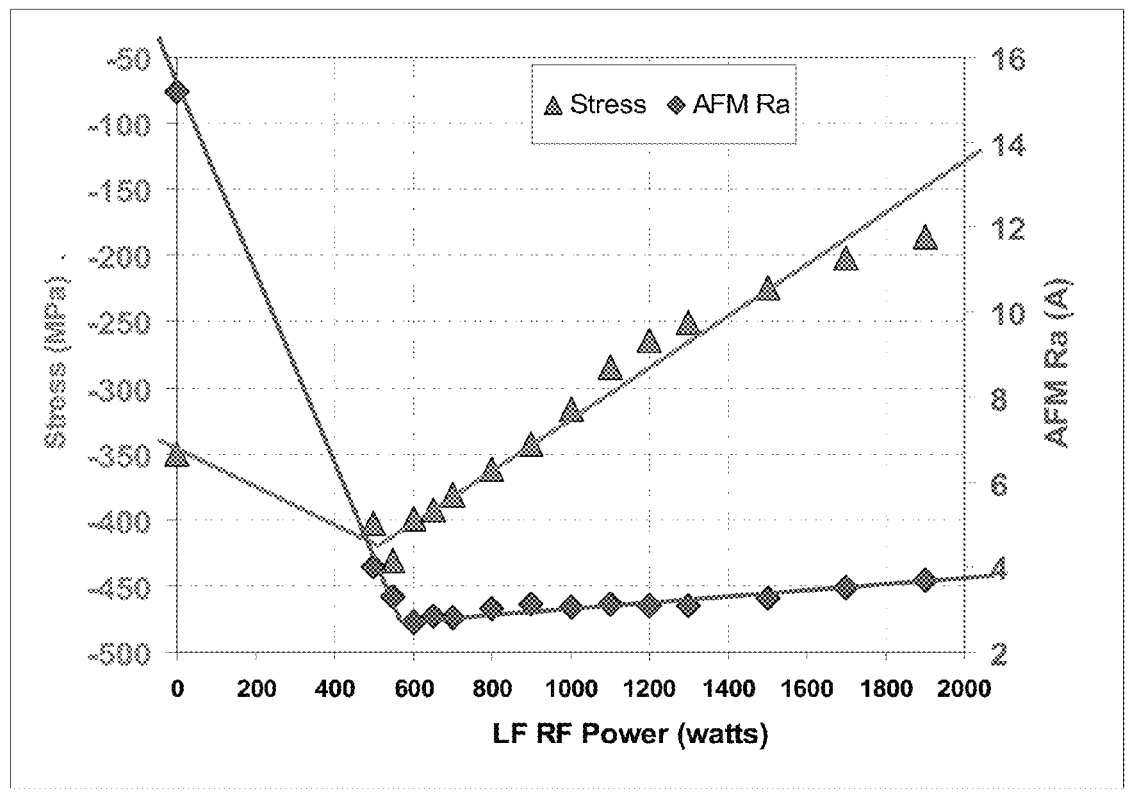
FIG. 2C is an experimental plot illustrating dependence of surface roughness and stress values of deposited silicon films on LF RF power levels.

The effect of LF power on stress values and roughness values of deposited films is illustrated in FIG. 2C, which is an experimental plot showing Ra and stress values of films deposited at different LF RF power levels. It can be seen that increasing LF RF power unexpectedly and dramatically improves stress values of the formed films, as shown by the series in triangles, while Ra values of less than about 5 Å are maintained, as shown by the series in diamonds.

While the use of LF RF power during PECVD deposition is highly advantageous, in some embodiments it is possible to obtain smooth silicon films with low compressive stress, and smooth silicon films with tensile stress using single-frequency (HF-only) PECVD. During such deposition the composition of the process gas is of high importance, and, in particular, the concentration of silicon-containing precursor should be kept very low in order to provide acceptable roughness values. In some embodiments during single frequency deposition it is preferable that the flow rate of silane is between about 0.05-1.5% of the total process gas flow.

Figure 3:
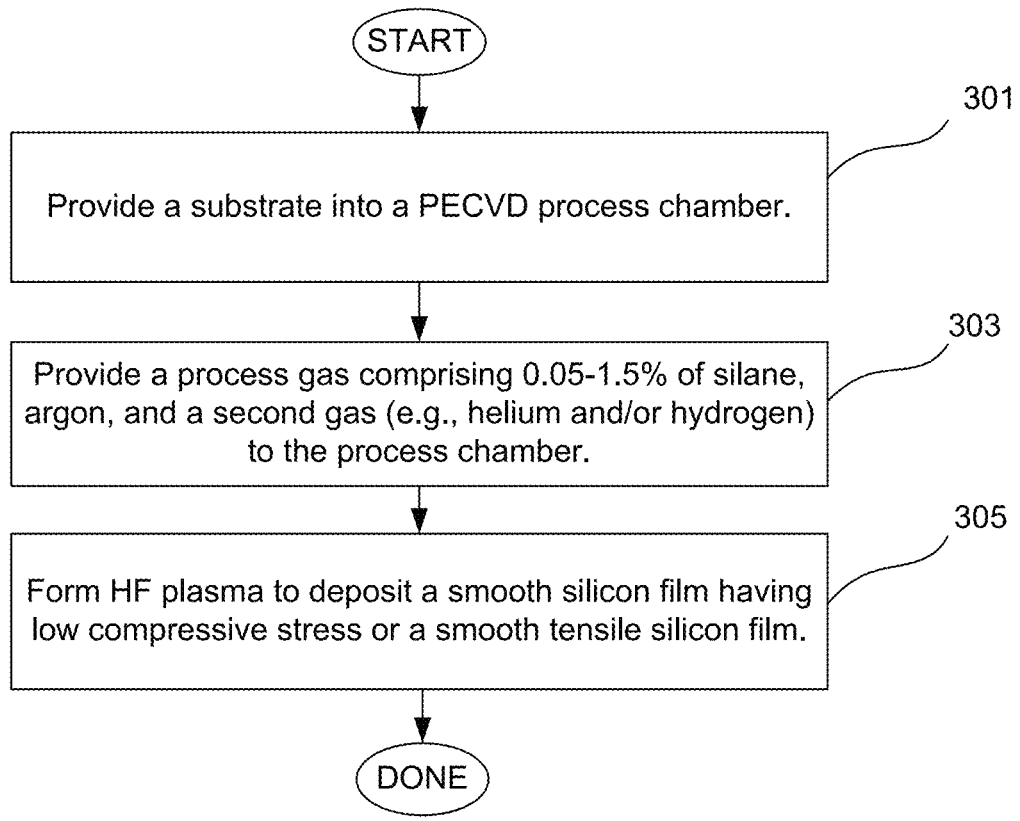
FIG. 3 is a process flow diagram illustrating a smooth silicon deposition method in accordance with an embodiment of the invention.

A process flow diagram for depositing a smooth silicon film using HF-only PECVD deposition is provided in FIG. 3. The process starts in 301 by providing a substrate into a PECVD process chamber. A process gas comprising 0.05-1.5% of silane, argon, and a second gas (e.g., helium and/or hydrogen) is introduced into the process chamber, as shown in 303, and HF RF plasma is generated to deposit a smooth silicon film with low compressive stress, or a smooth silicon film with tensile stress, as shown in 305.

Films with Ra of less than about 8 Å and compressive stress values of less than about 500 MPa (or films with tensile stress) can be obtained by this method. Further, films with Ra of less than about 7 Å (including films with Ra of less than about 5 Å) and compressive stress of less than about 300 MPa, can be obtained by this method.

Suitable process conditions for depositing smooth silicon films using single-frequency PECVD, are provided in Table 3. Deposition is performed using a process gas consisting essentially of silane, argon, helium, and, optionally, hydrogen using single frequency HF-only plasma. The flow rates and power levels are listed for an apparatus accommodating four 300 mm wafers. It is understood that one of skill in the art would be able to scale these values to the apparatus of any size, if desired.

TABLE 3

| | |
|---|---|
| Temperature | 350-650° C. |
| Pressure | 1-9 Torr |
| Silane, % of total flow | 0.05-1.3% |
| Argon, % of total flow | 2.3-67% |
| Silane flow | 10-60 sccm |
| Helium flow | 4,000-18,000 sccm |
| Hydrogen flow | 0-500 sccm |
| Argon flow | 500-3,000 sccm |
| Total flow | 4,510-21,560 sccm |
| HF power | 100-4,000 watts |

In this embodiment, HF RF power density is preferably in the range of between about 0.04-1.41 W/cm$^2$.

Figure 4:
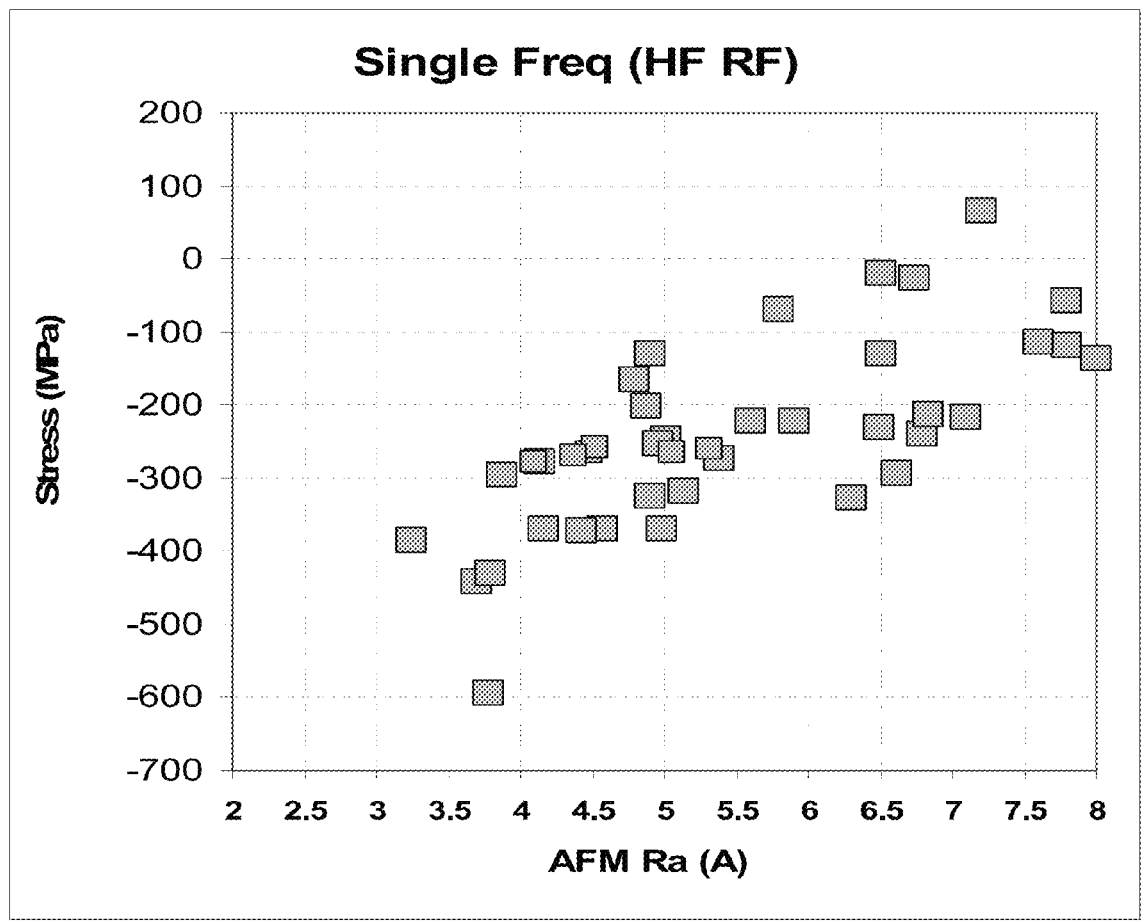
FIG. 4 is an experimental plot illustrating surface roughness and stress values of smooth silicon films deposited using HF RF-only PECVD, in accordance with an embodiment provided herein.

FIG. 4 illustrates properties of smooth silicon films deposited under the process conditions shown in Table 3. Ra values are shown on the X-axis, and stress values are shown on the Y-axis. It can be seen that provided methods can be used to form films which simultaneously have an Ra of less than 7 Å, and compressive stress of less than 500 MPa in absolute value, including films that simultaneously have Ra of less than 5 Å, and a compressive stress of less than 300 MPa in absolute value.

Example 7

In one experimental example, a smooth silicon film was deposited at a temperature of 550° C. and a pressure of 5.5 Torr from a process gas consisting essentially of silane (provided at 40 sccm, 0.4% of total process gas volume), argon (provided at 1,000 sccm, 11% of total process gas volume), and helium (provided at 8,000 sccm), using HF RF plasma (13.56 MHz), where HF power was 1,000 Watts, for a chamber housing four 300 mm wafers. The deposited smooth silicon film had Ra of 4.9 Å and a stress of −129 MPa.

Example 8

In another experimental example, a smooth silicon film was deposited at a temperature of 550° C. and a pressure of 7.0 torr from a process gas consisting essentially of silane (provided at 40 sccm, 0.4% of total process gas volume), argon (provided at 1,000 sccm, 11% of total process gas volume), and helium (provided at 8,000 sccm), using HF RF plasma (13.56 MHz), where HF power was 1,000 Watts, for a chamber housing four 300 mm wafers. The deposited smooth silicon film had Ra of 6.8 Å and a tensile stress of 66 MPa.

Smooth silicon germanium films can be deposited using the same principles as in the methods illustrated in FIGS. 1 and 3. Specifically, smooth silicon germanium films can be prepared using a process gas comprising a silicon-containing reactant (e.g., silane), a germanium-containing reactant (e.g., germane), argon, and a second gas (e.g., helium, hydrogen, or mixtures thereof) using dual frequency (HF RF and LF RF) PECVD, and in some embodiments, using HF-only PECVD.

Apparatus

The deposition of smooth silicon and silicon germanium films is implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation).

While in process, each wafer is held in place by a pedestal, wafer chuck and/or other wafer holding apparatus. For certain operations in which the wafer is to be heated, the apparatus may include a heater such as a heating plate. A wide variety of PECVD apparatuses can be used to practice provided methods. Examples of suitable apparatuses for practicing embodiments of the invention include a Vector™ (e.g., C23 Vector) or Sequel™ (e.g., C2 Sequel) reactor, produced by Novellus Systems of San Jose, Calif., and apparatuses described in the U.S. application Ser. No. 12/970,853 filed Dec. 16, 2010, titled "SMOOTH SILICON-CONTAINING FILMS" naming Fox et al. as inventors, which is herein incorporated by reference in its entirety.

Figure 5:
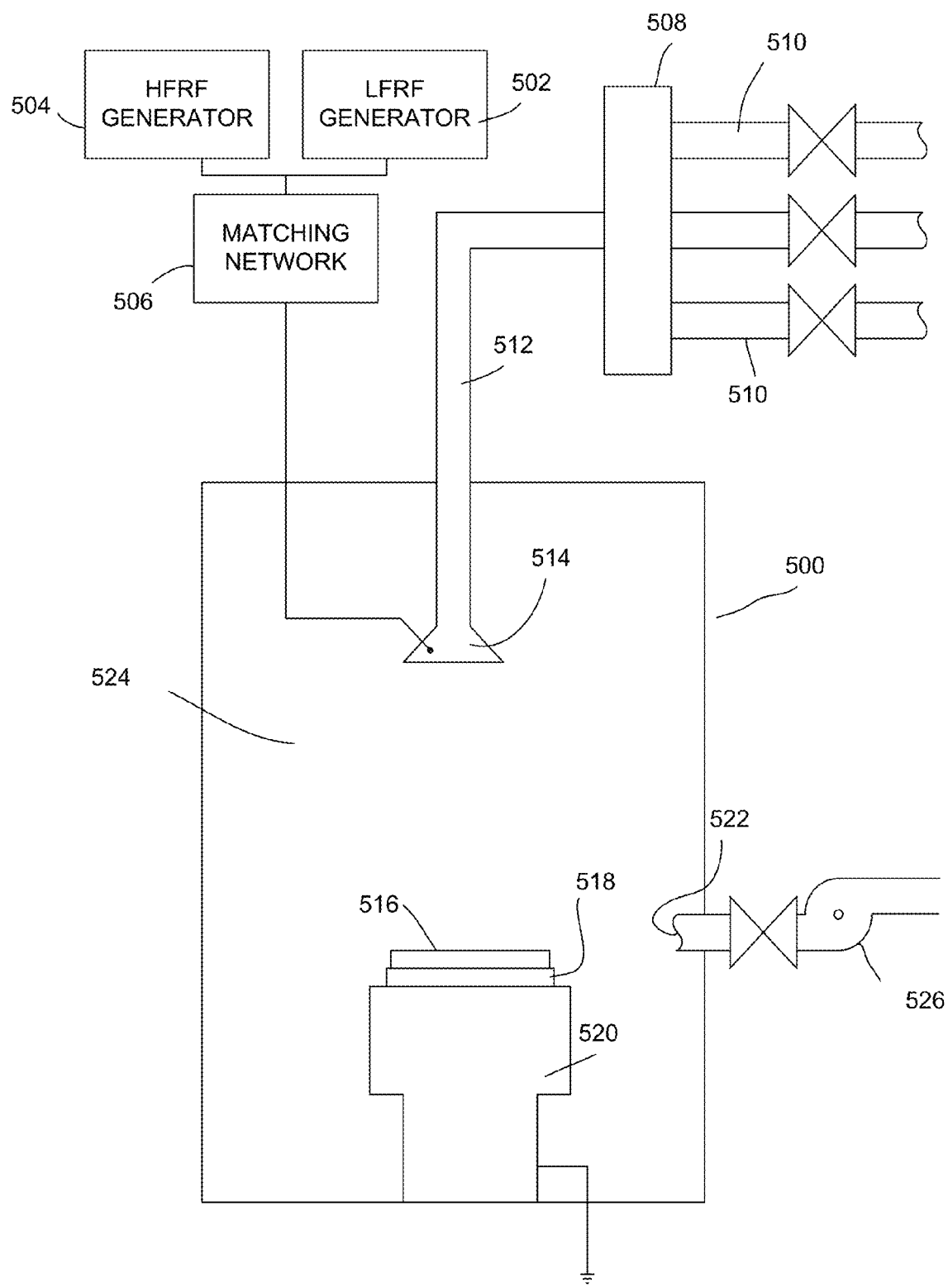
FIG. 5 shows a schematic depiction of a PECVD apparatus that is suitable for deposition of smooth silicon layers in accordance with embodiments provided herein.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 504, connected to a matching network 506, and, optionally, a low-frequency RF generator 502 are connected to showerhead 514. The power and frequency supplied by matching network 506 is sufficient to generate a plasma from the process gas. In a typical process, the high frequency RF component is generally between about 2-60 MHz; in a preferred embodiment, the HF component is about 13.56 MHz. The LF component frequency (when used) can range between about 100 kHz and 2 MHz. A typical frequency range for LF plasma source is between about 50 kHz to 500 kHz, more preferably, between about 370-430 kHz (e.g., 400 kHz).

Within the reactor, a wafer pedestal 518 supports a substrate 516. The pedestal typically includes a chuck, a fork, or lift pins to hold and transfer the substrate during and between the deposition. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The deposition of smooth silicon and silicon germanium films may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition until all the required depositions are completed, or multiple depositions can be conducted at a single station before indexing the wafer.

In certain embodiments, a system controller (not shown) is associated with the apparatus and is employed to control process conditions during deposition of the films, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of program instructions for controlling the timing, mixture of gases, chamber pressure, chamber temperature, wafer temperature, RF power levels, wafer chuck or susceptor position, and other parameters of a particular process. For example, instructions specifying flow rates of silicon-containing precursor, argon, and helium for silicon or silicon germanium film deposition may be included. In general, instructions may comprise instructions for process conditions for any of the processes described herein. The controller may comprise different or identical instructions for different apparatus stations, thus allowing the apparatus stations to operate either independently or synchronously.

Other computer programs stored on memory devices associated with the controller may be employed in some embodiments.

Typically there will be a user interface associated with controller. The user interface may include a display screen, graphical software displays of the apparatus and/or process conditions, and user input devices such as pointing devices, keyboards, touch screens, microphones, etc.

The computer program code for controlling the deposition processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, etc. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. A plasma control program may include code for setting RF power levels applied to the process electrodes at the target and the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

APPLICATIONS

In many embodiments, provided smooth silicon or smooth silicon germanium films are incorporated into stacks of multiple layers, such as stacks used during fabrication of 3D memory. The low roughness of provided films is particularly advantageous for these applications, because large stacks having low roughness can be obtained. For example, smooth stacks containing at least about 10 layers, e.g., at least about 50 layers, containing at least about 30% of layers of smooth silicon or smooth silicon germanium provided herein can be prepared. In many embodiments, the measured surface roughness of the formed stacks in their entirety is less than about 10 Å, such as less than about 5 Å. Low roughness of stacks is a particularly advantageous property for lithographic patterning, which is typically performed after the stacks have been deposited. More generally, these films can be used in a variety of applications, not limited to fabrication of 3D memory, e.g., these films can be used as hardmasks.

Figure 6:
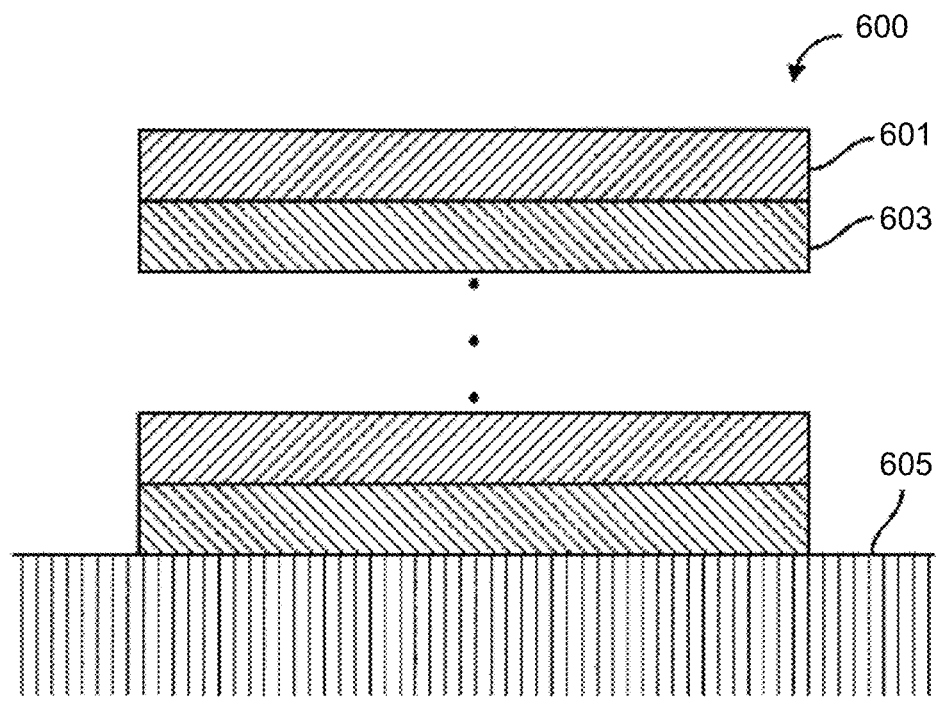
FIG. 6 is a schematic cross-sectional view of a multi-layer stack which incorporates a layer of smooth silicon or smooth silicon germanium.

FIG. 6 is a schematic cross-sectional depiction of a stack of films in accordance with embodiments provided herein. The stack 600 is deposited on a substrate 601 and contains a plurality of alternating layers 603 and 605, at least some of which are layers of smooth silicon or smooth silicon germanium deposited according to the methods provided herein. For example, in one embodiment one of the types of layers (e.g., 603) is smooth undoped polysilicon, and the other type of layers (e.g., 605) is a layer of doped silicon (e.g., boron-doped polysilicon), a layer of silicon germanium, a layer of silicon oxide, or a layer of silicon nitride. In another embodiment one of the types of layers (e.g., 603) is smooth silicon germanium, and the other type of layers (e.g., 605) is a layer of doped polysilicon (e.g., boron-doped polysilicon), undoped silicon, silicon oxide or silicon nitride. In yet another embodiment one of the types of layers (e.g., 603) is smooth doped polysilicon (e.g., boron-doped polysilicon), and the other type of layers (e.g., 605) is a layer of undoped polysilicon, silicon germanium, silicon oxide or silicon nitride. In some embodiments, it is preferable that all or most of the layers of the stack (including silicon oxide and silicon nitride layers, if present) are low-roughness layers having roughness of less than about 4 Å. Methods for depositing ultra-smooth silicon nitride and silicon oxide films are described in the U.S. application Ser. No. 12/970,853 filed Dec. 16, 2010, titled "SMOOTH SILICON-CONTAINING FILMS" naming Fox et al. as inventors, previously incorporated by reference in its entirety. In other embodiments, some of the layers of the stack may be deposited using conventional methods, and the stack as a whole would still have acceptable surface roughness, such as less than about 4 Å.

In some embodiments, the stacks contain between about 10-100 layers, where the layers alternate, e.g., smooth undoped polysilicon layer or a smooth silicon germanium layer alternates with a doped polysilicon layer, or smooth doped polysilicon layer alternates with a silicon nitride layer or a silicon oxide layer. The layers need not be of the same thickness, as some layers in the stack can be thicker than others, although the stacks may contain a plurality of alternating layers having substantially the same thickness. In some embodiments, alternating layers have a thickness in the range of between about 200-800 Å.

Advantageously, in some embodiments deposition of alternating layers in the stack is performed in one PECVD process chamber without a vacuum break. In some embodiments deposition of alternating layers is performed at one station of a multi-station PECVD process chamber. The following are examples of several process sequences that can be employed (with or without a vacuum break between deposition of layers).

(1) Deposit a layer of smooth doped silicon (e.g., boron doped polysilicon) using methods provided herein onto a layer of silicon oxide on a substrate; deposit a second layer of silicon oxide onto a layer of smooth doped silicon.

(2) Deposit a layer of smooth doped silicon (e.g., boron doped polysilicon) using methods provided herein onto a layer of silicon nitride on a substrate; deposit a second layer of silicon nitride onto a layer of smooth doped silicon.

(3) Deposit a layer of smooth doped silicon (e.g., boron doped polysilicon) onto a layer of undoped silicon on a substrate; deposit a second layer of undoped silicon onto a layer of smooth doped silicon, where smooth doped silicon and/or undoped silicon are deposited using methods provided herein.

(4) Deposit a layer of smooth doped silicon (e.g., boron doped silicon) onto a layer of silicon germanium on a substrate; deposit a second layer of silicon germanium onto a layer of smooth doped silicon, where smooth doped silicon and/or silicon germanium are deposited using methods provided herein.

(5) Deposit a layer of smooth undoped silicon onto a layer of doped silicon on a substrate; deposit a second layer of doped silicon onto a layer of smooth undoped silicon, where doped silicon and/or undoped silicon are deposited using methods provided herein.

(6) Deposit a layer of smooth silicon germanium onto a layer of doped silicon on a substrate; deposit a second layer of doped silicon onto a layer of smooth silicon germanium, where doped silicon and/or silicon germanium are deposited using methods provided herein.

(7) Deposit a layer of smooth undoped silicon using methods provided herein onto a layer of silicon nitride on a substrate; deposit a second layer of silicon nitride onto a layer of smooth undoped silicon.

In general, any combination of layers mentioned above can be deposited. In some embodiments, stacks containing layers of more than two types of materials are deposited. For example, in some embodiments, forming the stacks includes depositing a layer of silicon oxide, depositing a layer of smooth undoped silicon, and depositing a layer of smooth doped silicon, where doped and/or undoped silicon is deposited using provided methods.

After the stacks have been formed they are typically subjected to photolithographic patterning, which involves applying photoresist to the substrate; exposing the photoresist to light; patterning the resist and transferring the pattern to the substrate and selectively removing the photoresist from the substrate. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In some embodiments, a system including a PECVD apparatus having a controller with program instructions for performing provided deposition methods, and a stepper is used to implement deposition and patterning.

In other embodiments, smooth silicon and silicon germanium films serve as hardmasks. Hardmasks are typically deposited onto a layer of material (such as a layer of dielectric) residing on a semiconductor substrate to a thickness of between about 500-10,000 Å. A layer of photoresist and optionally another hardmask layer such as ashable carbon film is then typically deposited onto the smooth hardmask, and is lithographically patterned as described above, such that the desired pattern is transferred to the underlying hardmask layer.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a smooth silicon film on a semiconductor substrate in a plasma-enhanced chemical vapor deposition (PECVD) apparatus comprising a PECVD process chamber, the method comprising:
supplying a process gas to the PECVD apparatus, wherein the process gas comprises a silicon-containing precursor, argon, and helium, wherein the silicon-containing precursor is silane; and
depositing a smooth silicon film on the semiconductor substrate, the depositing comprising:
(a) flowing the process gas to the PECVD process chamber wherein the flow rate of silane is 0.05-12% of the total process gas flow rate, the flow rate of argon is 16-84% of the total process gas flow rate, and the flow rate of helium is 25-83% of the total process gas flow rate;
(b) forming a plasma using both high frequency (HF) and low frequency (LF) plasma generation, wherein the LF power is 17-80% of the total (HF and LF) power; and
(c) maintaining a deposition temperature of 350-550° C. and maintaining a pressure of 2-6 Torr in the PECVD process chamber;
wherein the deposited smooth silicon film is characterized by roughness (Ra) of less than about 7 Å, and a compressive stress of less than about 500 MPa in absolute value, or wherein the deposited smooth silicon film is tensile and is characterized by Ra of less than about 7 Å.

2. The method of claim 1, wherein the deposited smooth silicon film is characterized by Ra of less than about 5 Å, and a compressive stress of less than about 300 MPa in absolute value, or wherein the deposited smooth silicon film is a tensile film and is characterized by Ra of less than about 5 Å.

3. The method of claim 1, wherein the process gas comprises less than about 5% by volume of silane.

4. The method of claim 1, wherein the deposited film is a hardmask.

5. The method of claim 4, wherein the smooth silicon hardmask film is deposited to a thickness of between about 500-10,000 Å.

6. The method of claim 1, wherein the smooth silicon film is deposited in a memory device stack.

7. The method of claim 6, wherein the thickness of the deposited smooth silicon film in the memory device stack is between about 200-800 Å.

8. The method of claim 1, wherein the smooth silicon film is undoped.

9. The method of claim 1, wherein the smooth silicon film includes a dopant.

10. The method of claim 1, further comprising incorporating the smooth silicon film into a stack, comprising alternating layers of smooth silicon and a material selected from the group consisting of silicon oxide, silicon nitride, and doped silicon.

11. The method of claim 1 further comprising the steps of:
applying photoresist to the substrate;
exposing the photoresist to light;
patterning the resist and transferring the pattern to the substrate;
and selectively removing the photoresist from the substrate.

12. A method for forming a smooth silicon film on a semiconductor substrate in a plasma-enhanced chemical vapor deposition (PECVD) apparatus comprising a PECVD process chamber, the method comprising:
supplying a process gas to the PECVD apparatus, wherein the process gas comprises a silicon-containing precursor, argon, and a second gas, wherein the second gas comprises a gas selected from the group consisting of helium and hydrogen, and wherein the silicon-containing precursor is silane; and
depositing a smooth silicon film on the semiconductor substrate, the depositing comprising:
(a) flowing the process gas to the PECVD process chamber wherein the concentration of silane in the process gas is 0.05-1.5% by volume, and the concentration of argon in the process gas is 2-70% by volume;
(b) forming a plasma using single frequency high frequency (HF) plasma generation; and
(c) maintaining a deposition temperature of 350-650° C. and maintaining a pressure of 2-6 Torr in a PECVD deposition chamber;
wherein the deposited smooth silicon film is characterized by roughness (Ra) of less than about 7 Å, and a compressive stress of less than about 500 MPa in absolute value, or wherein the deposited smooth silicon film is tensile and is characterized by Ra of less than about 7 Å.

13. The method of claim 12, wherein the deposited smooth silicon film is characterized by Ra of less than about 5 Å, and a compressive stress of less than about 300 MPa in absolute value, or wherein the deposited smooth silicon film is a tensile film and is characterized by Ra of less than about 5 Å.

14. The method of claim 12, wherein the second gas is hydrogen.

15. The method of claim 12, wherein the second gas is helium.

16. The method of claim 12, wherein the second gas is a mixture of helium and hydrogen.

17. The method of claim 12, wherein the deposited film is a hardmask.

18. The method of claim 17, wherein the smooth silicon hardmask film is deposited to a thickness of between about 500-10,000 Å.

19. The method of claim 12, wherein the smooth silicon film is deposited in a memory device stack.

20. The method of claim 19, wherein the thickness of the deposited smooth silicon film in a memory device stack is between about 200-800 Å.

21. The method of claim 12, further comprising incorporating the smooth silicon film into a stack, comprising alternating layers of smooth silicon and a material selected from the group consisting of silicon oxide, silicon nitride, and doped silicon.

22. The method of claim 12 further comprising the steps of:
applying photoresist to the substrate;
exposing the photoresist to light;
patterning the resist and transferring the pattern to the substrate;
and selectively removing the photoresist from the substrate.

* * * * *